United States Patent
Moraveji

(10) Patent No.: US 6,876,244 B1
(45) Date of Patent: Apr. 5, 2005

(54) DIFFERENTIAL CHARGE PUMP

(75) Inventor: Farhood Moraveji, Saratoga, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/687,980

(22) Filed: Oct. 16, 2003

(51) Int. Cl.[7] .............................................. H03L 7/093
(52) U.S. Cl. ...................... 327/374; 327/132; 327/563; 331/16
(58) Field of Search .......................... 327/67, 131, 132, 327/134, 374, 563; 331/16

(56) References Cited

U.S. PATENT DOCUMENTS 5,736,880 A * 4/1998 Bruccoleri et al. ......... 327/157
5,856,757 A * 1/1999 Eschauzier .................. 327/553

FOREIGN PATENT DOCUMENTS

JP        10-336022    * 12/1998    ........... H03L/7/093

* cited by examiner

Primary Examiner—Timothy P. Callahan
Assistant Examiner—Terry L. Englund
(74) Attorney, Agent, or Firm—Bever, Hoffman & Harms, LLP

(57) ABSTRACT

A differential charge pump includes common mode circuitry for supplying a common mode voltage to a charging capacitor in the charge pump. The gate voltage of a reference transistor in a biasing branch of the differential charge pump is adjusted until the drain voltage of the reference transistor is equal to the common mode voltage when a specified bias current is flowing through the biasing branch. The same gate voltage and bias current are provided to a first transistor in a first common mode branch and a second transistor in a second common mode branch. The drains of the first transistor and the second transistor are connected to a first plate and a second plate, respectively, of the charging capacitor. In this manner, a desired common mode voltage is supplied to the charging capacitor.

28 Claims, 4 Drawing Sheets

DIFFERENTIAL CHARGE PUMP

BACKGROUND OF THE INVENTION

1. Field of the Invention

The invention relates to charge pumps, and in particular, to an accurate and stable differential charge pump.

2. Related Art

A differential charge pump converts a differential signal into an output voltage by charging a capacitor (or capacitors). FIG. 1 shows a conventional differential charge pump 100 that includes switches S(A), S(B), S(C), and S(D); current sources CS(A), CS(B), CS(C), and CS(D); and a charging capacitor 110.

Switch S(A), current source CS(A), current source CS(B), and switch S(B) are connected in series between supply voltage VDD and ground, thereby forming a first control branch B(A). Similarly, switch S(C), current source CS(C), current source CS(D), and switch S(D) are connected in series between supply voltage VDD and ground, thereby forming a second control branch B(B).

First control branch B(A) includes a terminal T(A) at the junction between current sources CS(A) and CS(B), while the second control branch B(B) includes a terminal T(B) at the junction between current sources CS(C) and CS(D). Capacitor 110 is connected between terminals T(A) and T(B), thereby allowing a differential output voltage VDIFF across capacitor 110 to be read via terminals T(A) and T(B).

Differential charge pump 100 charges or discharges capacitor 110 in response to binary control signals UP and DN. Switches S(A) and S(D) are configured to turn on only when signal UP is asserted HIGH. Meanwhile, switches S(C) and S(B) are configured to turn on only when signal DN is asserted HIGH.

Thus, when signal UP is asserted and signal DN is deasserted, switches S(A) and S(D) are on (closed) and switches S (B) and S (C) are off (open). As a result, current flows through current sources CS(A) and CS(D) while current sources CS(B) and CS(C) are inactive. The current sourced by current source CS(A) charges the plate of capacitor 110 connected to terminal T(A) (i.e., plate 110(A)), while the current sunk by current source CS(D) drains charge from the plate of capacitor 110 connected to terminal T(B) (i.e., plate 110(B)). This charging of plate 110(A) and discharging of plate 110(B) increases output voltage VDIFF.

Likewise, when signal DN is asserted and signal UP is deasserted, switches S(C) and S(B) are closed, while switches S(A) and S(D) are opened. In this case, current sources CS(A) and CS(D) are inactive, while current source CS(C) charges plate 110(B), while current source CS(B) discharges plate 110)(A). The discharging of plate 110(A) and charging of plate 110(B) decreases voltage VDIFF. Thus, differential charge pump 100 increases voltage VDIFF in response to signal UP and decreases voltage VDIFF in response to signal DN.

When differential charge pump 100 is first used, it is generally desirable that plates 110(A) and 110(B) both be at a particular "common mode" voltage. This ensures that the starting output voltage VDIFF is equal to zero. Also, by sizing the common mode voltage to be halfway between supply voltage VDD and ground (i.e., VDD/2), the allowable positive and negative changes in output voltage VDIFF can be maximized.

Unfortunately, when signals UP and DN are the same (i.e., both HIGH or both LOW, the voltage VDIFF across capacitor 110 will remain at whatever voltage was present when control branches B(A) and B(B) were last active. Consequently, each time differential charge pump 100 is used, plates 110(A) and 110(B) must be charged or discharged until they are both at the desired common mode voltage and output voltage VDIFF is set equal to zero. This "calibration" requirement can significantly increase the startup time for any circuit that incorporates differential charge pump 100.

In addition, differential charge pump 100 can also experience a dead zone if the corresponding switches (e.g., switches S(A) and S(D) or switches S(C) and S(B)) don't close at the same time, for example, due to propagation delays. In such circumstances, the terminal associated with the opened switch would be tri-stated, thereby creating a spurious reading of voltage VDIFF.

Accordingly, it is desirable to provide a differential charge pump that maintains a known common-mode voltage and has no dead zone.

SUMMARY OF THE INVENTION

The invention provides a differential charge pump that includes common mode circuitry for supplying a common mode voltage to the plates of a charging capacitor in the differential charge pump. The common mode circuitry includes a first common mode branch for applying a common mode voltage to a first plate of a charging capacitor, a second common mode branch for applying the common mode voltage to a second plate of the charging capacitor, and a biasing branch for controlling the operation of the first common mode branch and the second common mode branch.

According to an embodiment of the invention, the biasing branch includes a first bias pseudo-switch (constant-on switch), a reference transistor, a bias current transistor, and a second bias pseudo-switch, which are serially connected between supply voltage VDD and ground. The bias current transistor regulates the current flow through the biasing branch so that it is equal to a desired bias current. Meanwhile, the gate voltage of the reference transistor is adjusted until the drain voltage provided by the reference transistor is equal to a desired common mode voltage.

The first common mode branch includes a first pseudo-switch, a first transistor, a second transistor, and a second pseudo-switch, which are serially connected between supply voltage VDD and ground. The second common mode branch includes a third pseudo-switch, a third transistor, a fourth transistor, and a fourth pseudo-switch, which are serially connected between supply voltage VDD and ground. The first plate of the charging capacitor is connected to the junction between the first transistor and the second transistor, and the second plate of the charging capacitor is connected to the junction between the first transistor and the second transistor.

The second transistor and the fourth transistor are gate-coupled to the bias current transistor, so that the bias current flowing through the biasing branch is mirrored through the first and second common mode branches. Meanwhile, the first transistor and the third transistor are gate-coupled to the reference transistor. Because the first transistor and the third transistor receive the same gate voltage as the reference transistor (and the same bias current flows through the first transistor and the second transistor), the first transistor and the third transistor attempt to drive their drain voltages to the same level as the drain voltage of the common mode transistor (i.e., the desired common mode voltage). As a result, when not being charged or discharged in response to differential input signals, the plates of the charging capacitor are driven towards the common mode voltage by the common mode branches.

These and other aspects of the invention will be more fully understood in view of the following description of the exemplary embodiments and the drawings thereof.

DETAILED DESCRIPTION

Figure 1:
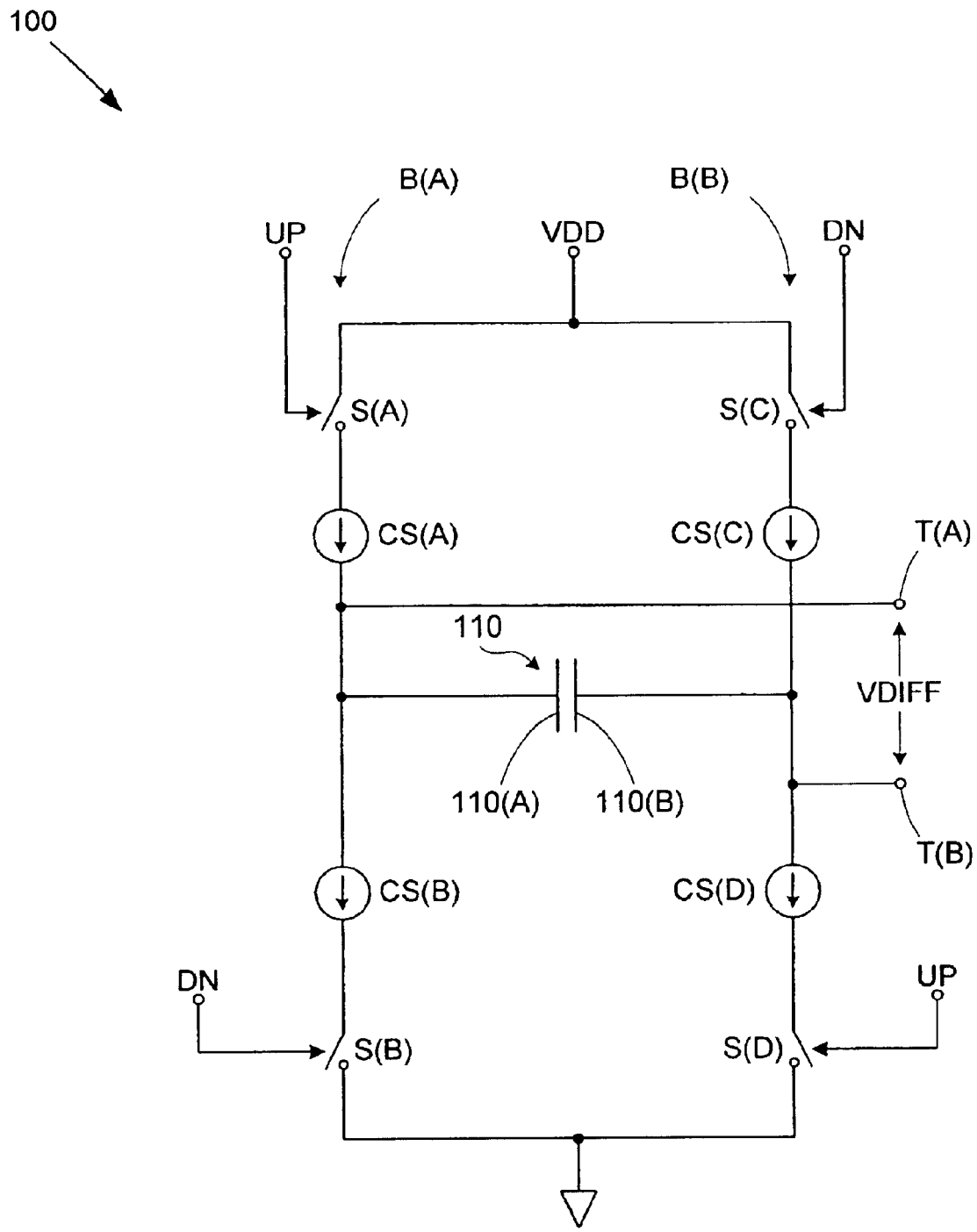
FIG. 1 is a schematic diagram of a conventional differential charge pump.
Figure 2A:
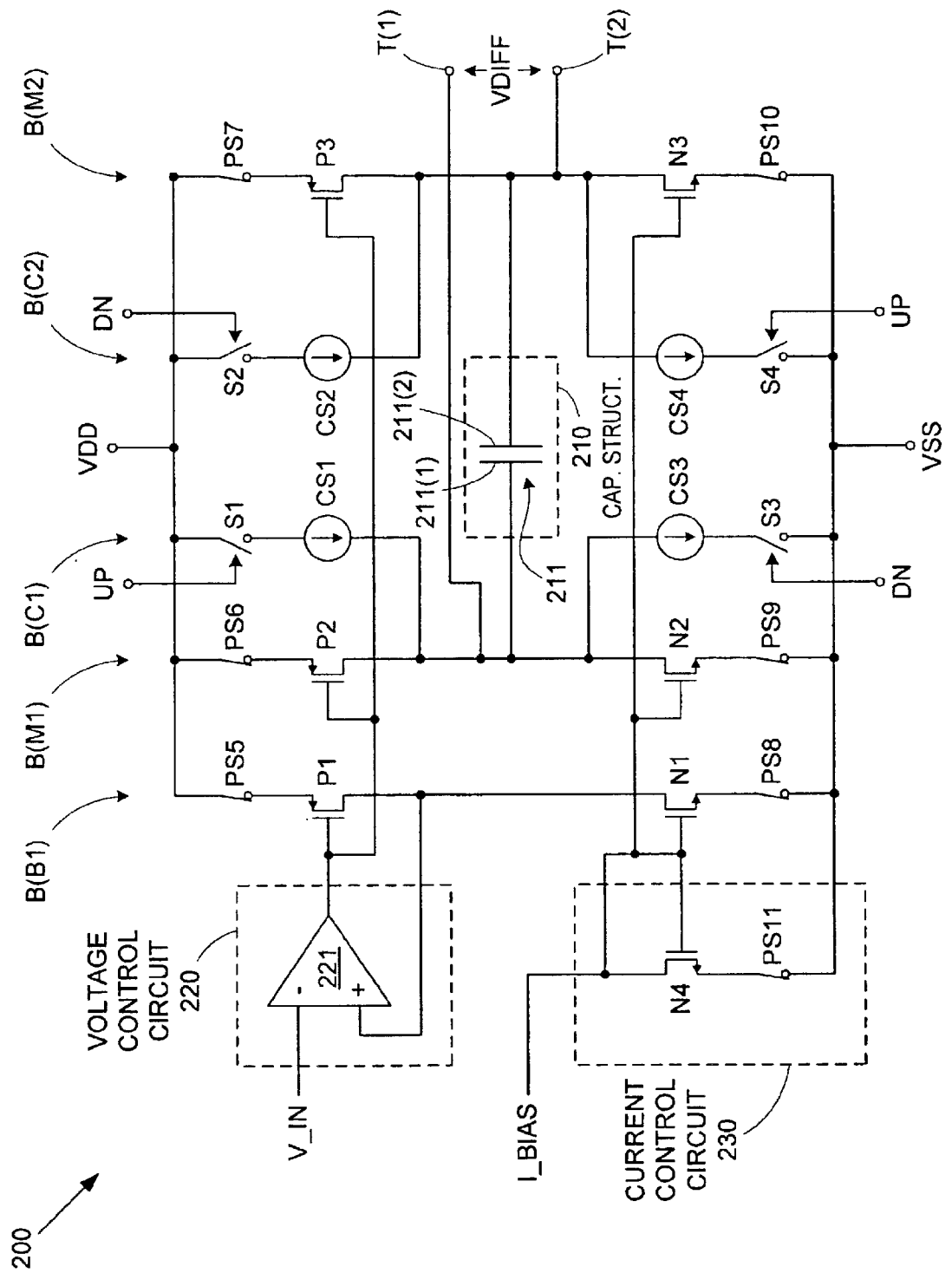
FIG. 2A is a schematic diagram of a differential charge pump in accordance with an embodiment of the invention.

FIG. 2A shows a differential charge pump 200 in accordance with an embodiment of the invention. As described below, differential charge pump 200 includes both control branches and common mode branches. The control branches provide charging control during dynamic operations (i.e., when the two digital control signals to differential charge pump 200 are not the same). Meanwhile, the common mode branches provide a predetermined common mode voltage to the capacitors) during common mode operations (i.e., when the digital control signals are the same—both logic HIGH or both logic LOW), thereby beneficially eliminating the need for pre-use calibrations and preventing dead zones.

As depicted in FIG. 2A, differential charge pump 200 includes: switches S1, S2, S3, S4; pseudo-switches PS5, PS6, PS7, PS8, PS9, and PS10; current sources CS1, CS2, CS3, and CS4; PMOS transistors P1, P2, and P3; NMOS transistors N1, N2, N3; a capacitive structure 210; a voltage control circuit 220; and a current control circuit 230.

Switch S1, current source CS1, current source CS3, and switch S3 are serially connected between a upper supply voltage VDD and lower supply voltage VSS (e.g., ground) to form a first control branch B(C1). Switch S2, current source CS2, current source CS4, and switch S4 are serially connected between upper supply voltage VDD and lower supply voltage VSS to form a second control branch B(C2).

Capacitive structure 210 is connected between a first output terminal T(1) at the junction between current sources CS and CS3 and a second output terminal T(2) at the junction between current sources CS2 and CS4. Therefore, a differential output voltage VDIFF across capacitive structure 210 can be read via terminals T(1) and T(2).

For explanatory purposes, the operation of differential charge pump 200 is described with respect to a single charging capacitor 211 in capacitive structure 210. Capacitor 211 includes a first plate 211(1) connected to output terminal T(1) and a second plate 211(2) connected to output terminal T(2). First plate 211(1) and second plate 211(2) are separated by a dielectric layer (not shown). However, according to various other embodiments of the invention, capacitive structure 210 can include any number of capacitors. Note also that, according to various other embodiments; of the invention, plates 211(1) and 211(2) can be connected to output terminals T(1) and T(2), respectively, by additional components, such as resistors or pass gates.

Figure 2B:
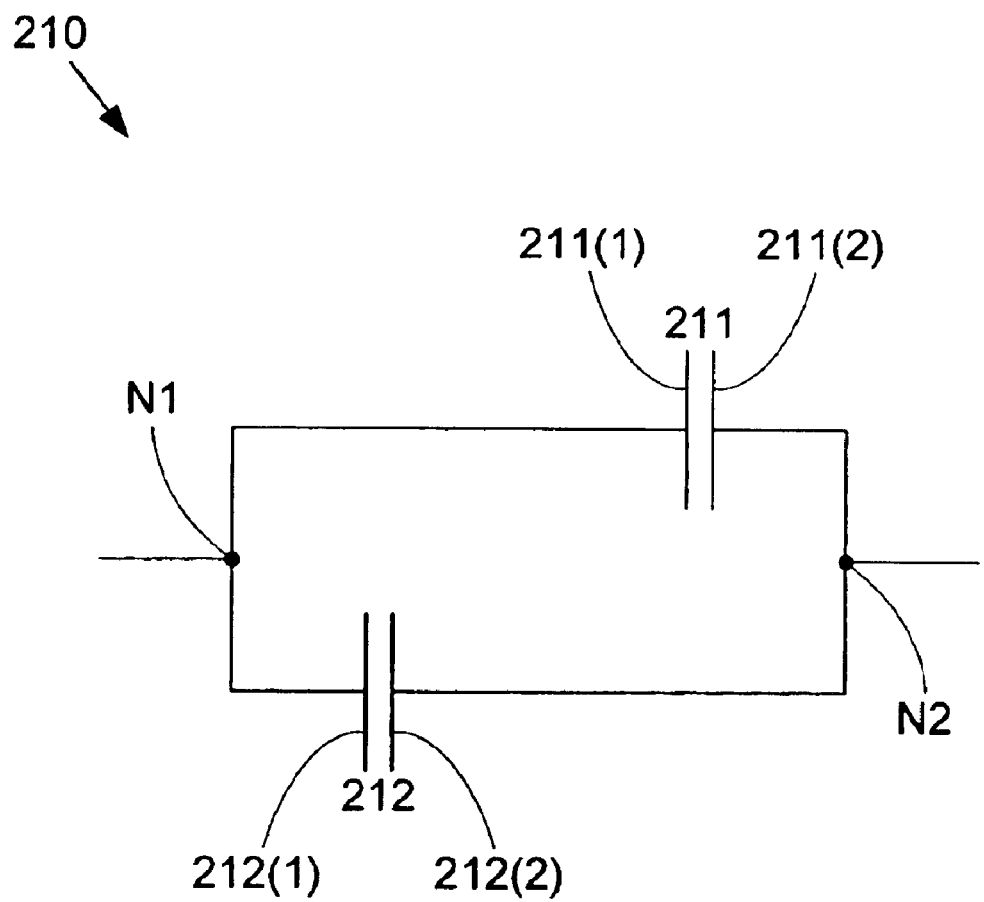
FIG. 2B is a schematic diagram of a capacitive structure that can be included in the differential charge pump of FIG. 2A.

For example, FIG. 2B shows a capacitive structure 210 according to another embodiment of the invention. Capacitive structure 210 in FIG. 2B includes capacitors 211 and 212 connected in parallel. Capacitor 211 includes plates 211(1) and 211(2), which are connected to nodes N1 and N2, respectively. Capacitor 212 includes plates 212(1) and 212(2), which are connected to nodes N1 and N2, respectively. By forming plates 211(1) and 212(2) in a first metal layer and by forming plates 211(2) and 212(1) in a second metal layer, parasitic capacitance effects (e.g., between the first metal layer and the substrate) can be minimized.

Returning to FIG. 2A, the behavior of control branches B(C1) and B(C2) is controlled by a pair of digital control signals UP and DN. Signal UP turns on (closes) switches S1 and S4, while signal DN turns on switches S2 and S3. Therefore, because current source CS1 is coupled between upper supply voltage VDD and plate 211(1) by switch S1, and because current source CS4 is coupled between plate 211(2) and lower supply voltage VSS by switch S4, when signal UP is asserted, capacitor 211 is charged by a current flowing between, current source CS1 and current source CS4. Similarly, because current source CS2 is coupled between upper supply voltage VDD and plate 211(2) by switch S2, and because current source CS3 is coupled between plate 211(1) and lower supply voltage VSS by switch S3, when signal DN is asserted, capacitor 211 is charged by a current flowing between current source CS2 and current source CS3. Therefore, when signal UP is asserted while signal DN is deasserted, the value of output voltage VDIFF is increased, and when signal UP is deasserted while signal DN is asserted, the value of output voltage VDIFF is decreased.

In this manner, when signal UP is asserted while signal DN is deasserted, the value of output voltage VDIFF is increased, and when signal UP is deasserted while signal DN is asserted, the value of output voltage VDIFF is decreased. Note that for explanatory purposes, signals UP and DN will be considered "asserted" when in a logic HIGH state, although the invention could just as well operate in response to control signals that are asserted to a logic LOW state.

According to an embodiment of the invention, switch S1, current source CS1, current source CS3, and switch S3 are matched to switch S2, current source CS2, current source CS4, and switch S4, respectively, thereby ensuring that the charging and discharging rates for capacitive structure 210 are substantially equal. Note that "matched" devices are devices that are configured to have substantially similar performance characteristics, typically through similar sizing and positioning.

In this manner, control branches B(C1) and B(C2) manage differential charge pump 200 during dynamic operations. However, as noted above, operation of differential charge pump 200 includes both dynamic operations (i.e., signals UP and DN different) and common mode operations (i.e., signals UP and DN the same). Therefore, to provide control over output voltage VDIFF during common mode operations, differential charge pump 200 further includes common mode branches B(M1) and B(M2), and a biasing branch B(B1).

Common mode branch B(M1) is formed by pseudo-switch PS6, PMOS transistor P2, NMOS transistor N2, and pseudo-switch PS9, which are serially connected between upper supply voltage VDD and lower supply voltage VSS. Common mode branch B(M2) is formed by pseudo-switch PS7, PMOS transistor P3, NMOS transistor N3, and pseudo-switch PS10, which are also serially connected between upper supply voltage VDD and lower supply voltage VSS. Pseudo-switches PS6, PS7, PS9, and PS10 are all constant-on (i.e., always closed) switches.

PMOS transistor P2 is also coupled between upper supply voltage VDD and output terminal T(1) (by constant-on switch S1, while PMOS transistor P3 is coupled between upper supply voltage VDD and output terminal T(2) (by constant-on switch S2). Therefore, capacitive structure 210 is not only connected across control branches B(C1) and B(C2), but is also connected across common mode branches B(M1) and B(M2). Consequently, common mode branches B(M1) and B(M2) can also adjust the voltage across capacitive structure 210 (and hence, can adjust differential output voltage VDIFF).

Biasing branch B(B1) is formed by (constant-on) pseudo-switch PS5, PMOS transistor P1, NMOS transistor N1, and (constant-on) pseudo-switch PS8, which are serially connected between upper supply voltage VDD and lower supply voltage VSS. Just as in common mode branches B(M1) and B(M2), pseudo-switches PS5 and PS8 are constant-on switches.

Biasing branch B(B1) controls the behavior and operation of common mode branches B(M1) and B(M2). Biasing branch B(B1) itself is controlled by current control circuit 230 and voltage control circuit 220, which impose a set of current and voltage parameters onto biasing branch B(B1). The operation of current control circuit 230 and voltage control circuit 220 is described below in detail.

Current control circuit 230 includes circuitry to force transistor N1 in biasing branch B(B1) to provide a desired current flow through biasing branch B(B1). According to an embodiment of the invention, current control circuit 230 includes an NMOS transistor N4 and a (constant-on) pseudo-switch PS11. NMOS transistor N4 is gate-drain coupled and connected to lower supply voltage VSS by pseudo-switch PS11. NMOS transistor N1 in biasing branch B(B1) is gate-coupled to transistor N4 in a current mirror configuration.

Thus, an input bias current I_BIAS that is supplied to the drain of transistor N4 is mirrored by transistor N1 through biasing branch B(B1). Then, because the gates of NMOS transistors N2 and N3 in common mode branches B(M1) and B(M2), respectively, are connected to the gate of transistor N1, transistors N2 and N3 act as current sources that mirror bias current I_BIAS through common mode branches B(M1) and B(M2), respectively.

Meanwhile, voltage control circuit 220 includes circuitry to cause transistor P1 in biasing branch B(B1) to provide a desired output—i.e., a particular voltage level at its drain. (Note that if transistor P1 were an NMOS transistor its output would appear at its source.) According to an embodiment of the invention, voltage control circuit 220 includes an operational amplifier (op-amp) 221. The output of op-amp 221 is connected to the gate of PMOS transistor P1, while the non-inverting input of op-amp 221 is connected to the drain of PMOS transistor P1.

Thus, an input voltage V_IN applied to the inverting input of op-amp 221 causes op-amp 221 to adjust the gate voltage of PMOS transistor P1 until the voltage at the drain of transistor P1 is equal to input voltage VIN. Then, because the gates of PMOS transistors P2 and P3 in common mode branches B(M1) and B(M2), respectively, are connected to the gate of transistor P1, transistors P2 and P3 receive the same gate voltage received by transistor P1 from op-amp 221.

Since the gate voltage and current through transistor P2 matches the gate voltage and current through transistor P1, the drain voltage of transistor P2 is driven to the same level as the source voltage of transistor P1 (i.e., to voltage V_IN). Similarly, because the gate voltage and current through transistor P3 matches the gate voltage and current through transistor P1, the drain voltage of transistor P3 is also driven to voltage VIN.

In this manner, common mode branches B(M1) and B(M2) provide voltage V_IN to plates 211(1) and 211(2), respectively, of capacitor 211, so that voltage V_IN represents the common mode voltage of differential charge pump 200. By providing thin "always on" common mode voltage to capacitor 211, common mode branches B(M1) and B(M2) also eliminate any dead zone that could otherwise arise due to mistiming between switches S1–S4.

Note that, if voltage VDIFF is not equal to zero when control branches B(Cl) and B(C2) are both inactive, common mode branches B(M1) and B(M2) will charge or discharge plates 211(1) and 211(2) as necessary to bring them both to voltage V_IN (and set voltage VDIFF equal to zero). For example, if plate 211(1) has a higher voltage than voltage VIN, the voltage across, transistor P2 is decreased, thereby decreasing the current sourced by transistor P2. However, transistor N2 still attempts to sink a current equal to current I_BIAS. Therefore, the charge stored on plate 211(1) provides this extra current flow until the voltage on plate 211(1) is reduced back to voltage V_IN and the current sourced by transistor P2 is the same as the current sunk by transistor N3. Similarly, if plate 211(1) has a lower voltage than voltage V-IN, the voltage across transistor P2 is increased, and the resulting excess current sourced by transistor P2 charges plate 211(1) until the voltage on plate 211(1) reaches voltage VIN.

According to an embodiment of the invention, input voltage V_IN can be set equal to half of upper supply voltage VDD (i.e., VDD/2), thereby maximizing the useful range of output voltage VDIFF. A common mode voltage equal to half of the supply voltage ensures that during dynamic operations, capacitor plate 211(1) is always charging while capacitor Plate 211(2) is discharging, and vice versa. Note, however, that according to various other embodiments of the invention, input voltage V_IN can be set equal to any desired voltage level.

Note that differential charge pump 200 is depicted and described using an exemplary combination of NMOS transistors (i.e., N1–N4) and PMOS transistors (i.e., P1–P3). According to various other embodiments of the invention, similar functionality could be provided using devices having other conductivity types.

For example, NMOS transistor N4 could be replaced with a gate-drain coupled PMOS transistor, which in turn would be gate-coupled to three PMOS transistors that replace NMOS transistors N1–N3. Similarly, transistor P1 could be replaced with an NMOS transistor having its drain connected to the inverting input of op-amp 221, while transistors P2 and P3 could be replaced with NMOS transistors, with the drains of those transistors being connected to plates 211(1) and 211(2), respectively.

According to another embodiment of the invention, the accuracy of the common mode voltage provided by common mode branches B(M1) and B(M2) can be optimized by matching transistors P1, P2, and P3, and by matching transistors N1, N2, and N3. According to another embodiment of the invention, additional increases in common mode voltage accuracy can be achieved if switches PS5, PS6, and PS7 are matched, and switches PS6, PS9, and PS10 are matched.

According to another embodiment of the invention, common mode branches B(M1) and B(M2) are configured to have performance characteristics similar to control branches B(C1) and B(C2), respectively. Specifically, pseudo-switch PS6, PMOS transistor P2, NMOS transistor N2, and pseudo-switch PS9 in common mode branch B(M1) are matched to switch S1, current source CS1, current source CS3, and switch S3, respectively, in control branch B(C1). Similarly, pseudo-switch PS7, PMOS transistor P3, NMOS transistor N3, and pseudo-switch PS10 in common mode branch B(M2) are matched to switch S2, current source CS2, current source CS4, and Switch S4, respectively, in control branch B(C2).

Matching components in this manner ensures that common mode branches B(M1) and B(M2) are not overwhelmed by control branches B(C1) and B(C2), and vice versa. In other words, the current flows through common mode branches B(M1) and B(M2) are, large enough to restore the plates of capacitive structure 210 to their nominal common mode voltage in a reasonable time, but not so large that they excessively dampen the charging and discharging effects of control branches B(C1) and B(C2).

Figure 3:
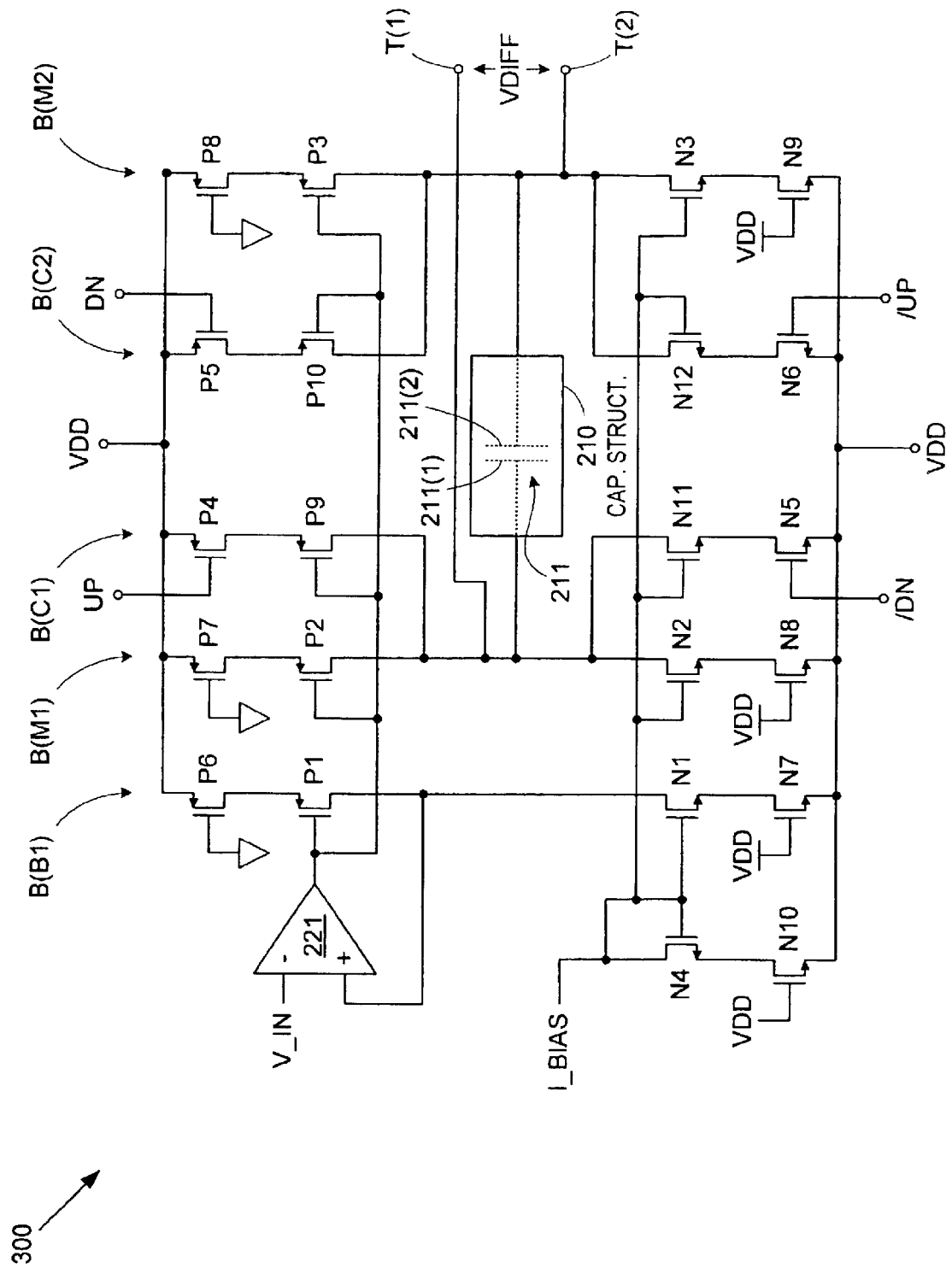
FIG. 3 is a schematic diagram of a differential charge pump in accordance with another embodiment of the invention.

For example, FIG. 3 shows a schematic diagram of a differential charge pump 300 according to an embodiment of the invention. Differential charge pump 300 is substantially similar to differential charge pump 200 shown in FIG. 2A, with switches S1 and S2 implemented by PMOS transistors P4 and P5, respectively; pseudo-switches PS5, PS6, and PS7 implemented by PMOS transistors P6, P7, and P8, respectively; switches S3 and S4 implemented by NMOS transistors N5 and N6, respectively; pseudo-switches PS8, PS9, PS10, and PS11 implemented by NMOS transistors N7, N8, N9, and N10, respectively; current sources CS1 and CS2 implemented by PMOS transistors P9 and P10, respectively; and current sources CS3 and CS4 implemented by NMOS transistors N11 and N12, respectively.

The transistors in differential charge pump 300 that replace the switches and current sources of differential charge pump 200 provide the same functionality (described above) as those switches and current sources. For example, PMOS transistors P6–P8 are all gate-coupled to lower supply voltage VSS, and therefore behave as constant-on ;switches. Similarly, NMOS transistors N7–N10 are all gate-coupled to upper supply voltage VDD, and therefore also behave as constant-on switches. Therefore, the operation of differential charge pump 300 is substantially similar to that of differential charge pump 200.

For example, just as described with respect to FIG. 2A, bias current I_BIAS supplied to transistor N4 is mirrored by transistor N1 into biasing branch B(B1), while input voltage V_IN provided to the inverting input terminal of op-amp 221 adjusts that gate voltage of transistor P1 until the drain voltage of transistor P1 is equal to voltage V_IN. Transistors N2 and N3 (gate-coupled to transistor N1) mirror current I_BIAS through common mode branches S(M1) and B(M2), respectively, so that the drain voltages of transistors P2 and P3 (gate-coupled to transistor P1) provide a common mode voltage V_IN to capacitive structure 210.

Due to the nature of semiconductor materials, a fully-on PMOS transistor exhibits a minimal voltage drop when coupled to a high voltage (such as upper supply voltage VDD), while a fully-on NMOS transistor exhibits a minimal voltage drop when coupled to a low voltage (such as lower supply voltage VSS). Therefore, by implementing the switches to voltage VDD using PMOS transistors (i.e., PMOS transistors P4–P8) and by implementing the switches to lower supply voltage VSS using NMOS transistors (i.e., NMOS transistors N5–N10), the range of output voltage VDIFF provided by differential charge pump 300 can be maximized. Note, however, that according to various other embodiments of the invention, the switches in differential charge pump 300 could be implemented using devices having any combination of conductivity types (e.g., all P-type transistors or all N-type transistors).

To provide the appropriate charge pump action in response to control signals UP and DN, PMOS transistor P4 and NMOS transistor N6 must turn on in response to signal UP, while PMOS transistor P5 and NMOS transistor N5 must turn on in response to signal DN. Therefore, NMOS transistors N6 and N5 must receive the complements of the signals provided to PMOS transistors P4 and P5, respectively. According to an embodiment of the invention, inverters could be placed at the gates of PMCS transistors P4 and P5, or at the gates of NMOS transistors N5 and N6, depending on the nature of signals UP and DN.

For example, if signals UP and DN are raised to logic HIGH levels when asserted, inverters could be placed at the gates of PMOS transistors P4 and N5. Then, the assertion of signal UP would result in a logic LOW being provided at the gate of PMOS transistor P4 and a logic HIGH being provided at the gate of NMOS transistor N6, and the assertion of a signal DN would result in a logic LOW being provided at the gate of PMOS transistor P5 and a logic HIGH being provided at the gate of NMOS transistor N5.

On the other hand, if signals UP and DN are placed at logic LOW levels when asserted, inverters could be placed at the gates of NMOS transistors N5 and N6. Then, the assertion of signal UP would still result in a logic LOW being provided at the gate of PMOS transistor P4 and a logic HIGH being provided at the gate of NMOS transistor N6, and the assertion of a signal DN would still result in a logic LOW being provided at the gate of PMOS transistor P5 and a logic HIGH being provided at the gate of NMOS transistor N5.

Because the gates of transistors P9 and P10 are connected to the gate of transistor P1, which is held at a particular voltage by op-amp 221, transistors P9 and P10 are current sources for current I_BIAS (i.e., they can source currents equal to current I_BIAS). Likewise, because the gates of transistors N11 and N12 are connected to the gate of transistor N1, transistors N11 and N12 are also current sources for current I_BIAS (i.e., they can sink currents equal to current I_BIAS).

Therefore, when transistors P4 and N6 are on and transistors PS and NS are off (i.e., signal UP asserted and signal DN deasserted), the current sourced by transistor P9 charges plate 211(1) of capacitor 211, while the current sunk by transistor N12 discharges plate 211(2). When transistors P4 and N6 are off and transistors P5 and N5 are on (i.e., signal UP deasserted and signal DN asserted), the current sunk by transistor N11 discharges plate 211(1) while the current sourced by transistor P10 charges plate 211(2).

The various embodiments of the structures and methods of this invention that are described above are illustrative only of the principles of this invention and are not intended to limit the scope of the invention to the particular embodiments described. For example, while differential charge pump 300 in FIG. 3 is depicted as a CMOS circuit, according to various other embodiments of the invention, a straight NMOS or PMOS process, or even a bipolar process, could be used to implement the circuit. Also, the constant-on pseudo-switches PS5–PS11 of differential charge pump 200 in FIG. 2A could be replaced with controllable switches that allow the common mode capability of differential charge pump 200 to be selectively enabled or disabled. Thus, the invention is limited only by the following claims and their equivalents.

What is claimed is:

1. A differential charge pump comprising:
    a capacitive structure having a first plate and a second plate;
    a first control branch for charging the first plate when a first signal is asserted, and discharging the first plate when a second signal is asserted;
    a second control branch for discharging the second plate when the first signal is asserted, and charging the second plate when the second signal is asserted;
    a first common mode branch for charging or discharging the first plate to a common mode voltage when the first signal and the second signal are at the same level; and
    a second common mode branch for charging or discharging the second plate to the common mode voltage when the first signal and the second signal are at the same level.

2. The differential charge pump of claim 1, wherein the first common mode branch comprises a first transistor coupled between a first supply voltage and the first plate,
    wherein the second common mode branch comprises a second transistor coupled between the first supply voltage and the second plate, and
    wherein the differential charge pump further comprises a voltage control circuit for supplying a first gate voltage to a gate of the first transistor and second gate voltage to a gate voltage of the second transistor, the first gate voltage causing the first transistor to provide the common mode voltage to the first plate, and the second gate voltage causing the second transistor to provide the common mode voltage to the second plate.

3. The differential charge pump of claim 2, wherein the voltage control circuit comprises:
    an operational amplifier (op-amp); and
    a third transistor coupled between the first supply voltage and a first input of the op-amp, wherein a gate of the third transistor is connected to the gate of the first transistor, the gate of the second transistor, and an output of the op-amp, and wherein a second input of the op-amp is coupled to receive the common mode voltage.

4. The differential charge pump of claim 3, wherein the first transistor, the second transistor, and the third transistor are PMOS transistors,
    wherein the first input of the op-amp is a non-inverting input, and
    wherein the second input of the op-amp is an inverting input.

5. The differential charge pump of claim 3, wherein the first transistor, the second transistor, and the third transistor are NMOS transistors,
    wherein the first input of the op-amp is an inverting input, and
    wherein the second input of the op-amp is a non-inverting input.

6. The differential charge pump of claim 3, wherein the first common mode branch further comprises a fourth transistor coupled between the first plate and a second supply voltage,
    wherein the second common mode branch further comprises a fifth transistor coupled between the second plate and the second supply voltage, and wherein the differential charge pump further comprises a bias current control circuit for gate-biasing the fourth transistor and the fifth transistor as current sources for a bias current.

7. The differential charge pump of claim 6, wherein the bias current control circuit comprises:
    a sixth transistor; and
    a seventh transistor coupled to receive the bias current, wherein the seventh transistor is gate-drain coupled, and wherein a gate of the seventh transistor is connected to the gate of the fourth transistor, a gate of the fifth transistor, and a gate of the sixth transistor.

8. The differential charge pump of claim 7, wherein the first transistor, the second transistor, and the third transistor are coupled to the first supply voltage by a first constant-on switch, a second constant-on switch, and a third constant-on switch, respectively, and
    wherein the fourth transistor, the fifth transistor, the sixth transistor, and the seventh transistor are coupled to the second supply voltage by a fourth constant-on switch, a fifth constant-on switch, a sixth constant-on switch, and a seventh constant-on switch, respectively.

9. The differential charge pump of claim 8, wherein the first transistor, the second transistor, and the third transistor are matched, and wherein the fourth transistor, the fifth transistor, the sixth transistor, and the seventh transistor are matched.

10. The differential charge pump of claim 8, wherein the first control branch comprises a first current source coupled between the first supply voltage and the first plate by a first controllable switch and a second current source coupled between the first plate and the second supply voltage by a second controllable switch, and
    wherein the second control branch comprises a third current source coupled between the first supply voltage and the second plate by a third controllable switch and a fourth current source coupled between the second plate and the second supply voltage by a fourth controllable switch,
    wherein the first controllable switch and the fourth controllable switch close when the first signal is asserted, and
    wherein the second controllable switch and the third controllable switch close when the second signal is asserted.

11. The differential charge pump of claim 10, wherein the first transistor, the second transistor, the third transistor, the first current source, and the third current source are matched transistors,
    wherein the fourth transistor, the fifth transistor, the sixth transistor, the seventh transistor, the second current source, and the fourth current source are matched transistors,
    wherein the first constant-on switch, the second constant-on switch, the third constant-on switch, the first controllable switch, and the third controllable switch are matched transistors, and
    wherein the fourth constant-on switch, the fifth constant-on switch, the sixth constant-on switch, the seventh constant-on switch, the second controllable switch, and the fourth controllable switch are matched transistors.

12. A method for operating a differential charge pump, the method comprising:
    providing a charging capacitor having a first plate and a second plate, the first plate being separated from the second plate by a dielectric;
    charging the first plate and discharging the second plate when a first signal is asserted and a second signal is deasserted;

charging the second plate and discharging the first plate when the first signal is deasserted and the second signal is asserted; and driving the first plate and the second plate to a common mode voltage when the first signal and the second signal are at the same level.

13. The method of claim 12, wherein driving the first plate and the second plate to the common mode voltage comprises:

supplying a first gate voltage to a first transistor coupled between a first supply voltage and the first plate and a second transistor coupled between the first supply voltage and the second plate, wherein the first gate voltage causing the first transistor and the second transistor to provide the common mode voltage to the first plate and the second plate, respectively;

supplying a second gate voltage to a third transistor coupled between the first plate and a second supply voltage and a fourth transistor coupled between the second plate and the second supply voltage, the second gate voltage causing the third transistor and the fourth transistor to source a bias current.

14. The method of claim 13, wherein supplying the first gate voltage comprises supplying the common mode voltage to a first input of an operational amplifier (op-amp), wherein an output of the op-amp is coupled to a gate of a fifth transistor, the fifth transistor being coupled between the first supply voltage and a second input of the op-amp, and wherein the gate of the fifth transistor is coupled to a gate of the first transistor and a gate of the second transistor.

15. The method of claim 14, wherein the first transistor, the second transistor, and the fifth transistor are PMOS transistors, wherein the first input of the op-amp is an inverting input, and wherein the second input of the op-amp is a non-inverting input.

16. The method of claim 14, wherein the first transistor, the second transistor, and the fifth transistor are NMOS transistor, wherein the first input of the op-amp is a non-inverting input, and wherein the second input of the op-amp is an inventing input.

17. The method of claim 14, wherein supplying the second gate voltage comprises supplying the bias current to a sixth transistor, the sixth transistor being gate-drain coupled, wherein a gate of the sixth transistor is coupled to a gate of a seventh transistor, the seventh transistor being coupled between the fifth transistor and the second supply voltage, and wherein the gate of the seventh transistor is coupled to gate of the third transistor and a gate of the fourth transistor.

18. A differential charge pump comprising:

a first control branch coupled between a first supply voltage and a second supply voltage;

a second control branch coupled between the first supply voltage and the second supply voltage;

a capacitive structure coupled between the first control branch and the second control branch;

a first transistor coupled between the first supply voltage and a first plate of the capacitive structure;

a second transistor coupled between the first supply voltage and a second plate of the capacitive structure;

a third transistor, wherein a gate of the third transistor is connected to a gate of the first transistor and a gate of the second transistor; and a voltage control circuit for regulating a first gate voltage at the gate of the third transistor to cause the third transistor to output a common mode voltage.

19. The differential charge pump of claim 18, wherein the voltage control circuit comprises an operational amplifier (op-amp), wherein the third transistor is coupled between the first supply voltage and a first input of the op-amp, wherein an output of the op-amp is coupled to the gate of the third transistor, and wherein a second input of the op-amp is coupled to receive the common mode voltage.

20. The differential charge pump of claim 19, wherein the third transistor is a PMOS transistor, wherein the first input of the op-amp is a non-inverting input, and wherein the second input of the op-amp is an inverting input.

21. The differential charge pump of claim 19, wherein the third transistor is an NMOS transistor, wherein the first input of the op-amp is an inverting input, and wherein the second input of the op-amp is a non-inverting input.

22. The differential charge pump of claim 19, wherein the common mode voltage is half of the first supply voltage.

23. The differential charge pump of claim 18, further comprising:

a fourth transistor coupled between the first plate and the second supply voltage;

a fifth transistor coupled between the second plate and the second supply voltage;

a sixth transistor coupled between the third transistor and the second supply voltage, wherein a gate of the sixth transistor is coupled to a gate of the fourth transistor and a gate of the fifth transistor; and a current control circuit for providing a second gate voltage to the sixth transistor to cause the sixth transistor to source a bias current.

24. The differential charge pump of claim 23, wherein the current control circuit comprises a seventh transistor coupled to receive the bias current, wherein the seventh transistor is gate-drain coupled, and wherein a gate of the seventh transistor is coupled to the gate of the sixth transistor.

25. The differential charge pump of claim 24, wherein the first transistor, the second transistor, and the third transistor are matched transistors, and wherein the fourth transistor, the fifth transistor, the sixth transistor, and the seventh transistor are matched transistors.

26. The differential charge pump of claim 24, wherein the first transistor, the second transistor, and the third transistor are coupled to the first supply voltage by a first constant-on switch, a second constant-on switch, and a third constant-on switch, respectively, and wherein the fourth transistor, the fifth transistor, the sixth transistor, and the seventh transistor are connected to a second supply voltage by a fourth constant-on switch, a fifth constant-on switch, a sixth constant-on switch, and a seventh constant-on switch, respectively.

27. The differential charge pump of claim 26, wherein the first transistor, the second transistor, and the third transistor are matched transistors, wherein the first constant-on switch, the second constant-on switch, and the third constant-on switch are matched transistors, wherein the fourth transistor, the fifth transistor, the sixth transistor, and the seventh transistor are matched transistors, and wherein the fourth constant-on switch, the fifth constant-on switch, the sixth constant-on switch, and the seventh constant-on switch are matched transistors.

28. The differential charge pump of claim 19, wherein the first plate and the second plate form a first capacitor, and wherein the capacitive structure further comprises a third plate and a fourth plate forming a second capacitor, the third plate being connected to the first plate, and the fourth plate being connected to the second plate, wherein the first plate and the fourth plate are formed in a first metal layer, and wherein the second plate and the third plate are formed in a second metal layer.

* * * * *

UNITED STATES PATENT AND TRADEMARK OFFICE
CERTIFICATE OF CORRECTION

PATENT NO. : 6,876,244 B1
DATED : April 5, 2005
INVENTOR(S) : Farhood Moraveji

It is certified that error appears in the above-identified patent and that said Letters Patent is hereby corrected as shown below:

Column 11,
Line 44, replace "inventing" with -- inverting --.
Line 54, insert -- a -- after "to".

Signed and Sealed this

Fifth Day of July, 2005

JON W. DUDAS
*Director of the United States Patent and Trademark Office*